United States Patent [19]

Long et al.

[11] 4,012,097

[45] Mar. 15, 1977

[54] COMBINED TEST CLIP AND COMPONENT EXTRACTION TOOL

[75] Inventors: Walter J. Long, Upland; Lawrence E. Wysocki, Covina; George M. Wohlhieter, Upland, all of Calif.

[73] Assignee: Everett/Charles, Inc., Pomona, Calif.

[22] Filed: Oct. 17, 1975

[21] Appl. No.: 623,332

[52] U.S. Cl. .......................... 339/45 M; 324/158 F; 339/255 P; 339/261
[51] Int. Cl.² ...................................... H01R 13/62
[58] Field of Search ............... 339/45 R, 45 M, 46, 339/75 MP, 255 P, 261; 324/158 F

[56] References Cited

UNITED STATES PATENTS

| | | | |
|---|---|---|---|
| 2,261,761 | 11/1941 | Hanson et al. | 339/255 P |
| 2,472,177 | 6/1949 | Taber | 339/255 P X |
| 3,506,949 | 4/1970 | Venaleck et al. | 339/75 MP X |
| 3,850,490 | 11/1974 | Zehr | 339/255 P X |
| 3,914,007 | 10/1975 | Seidler | 339/261 X |

FOREIGN PATENTS OR APPLICATIONS 1,934,752   1/1971   Germany .................. 324/158 F

OTHER PUBLICATIONS

Ross, T., *Test Socket,* in IBM Technical Disclosure Bulletin, vol. 10, No. 5, pp. 549–550, Oct. 1967.

*Primary Examiner*—Roy Lake
*Assistant Examiner*—Howard N. Goldberg
*Attorney, Agent, or Firm*—Christie, Parker & Hale

[57] ABSTRACT

A body is provided including opposite ends, opposite sides and a top and a bottom. A pair of upstanding levers are pivotally secured, intermediate their upper and lower end portions, to opposite end portions of the body for limited oscillation about axes transverse to the levers and the body. Spring structure is provided for yieldingly biasing the upper ends of the levers apart and the body includes opposite side rows of elongated longitudinally spaced relatively insulated contacts projecting endwise outwardly and downwardly from opposite side portions of the bottom of the body. The lower ends of the levers include coacting opposite side depending conductive hooks opening longitudinally of the body toward the remote levers and corresponding side hooks of the levers are spaced apart in planes spaced slightly inwardly of the corresponding side contacts. The contacts comprise spring contacts and the depending lower end portions thereof may be at least slightly biased outwardly of the corresponding sides of the body, the inner portions of the lower ends of the contacts being beveled and the contacts projecting at least slightly below the corresponding hooks.

13 Claims, 5 Drawing Figures

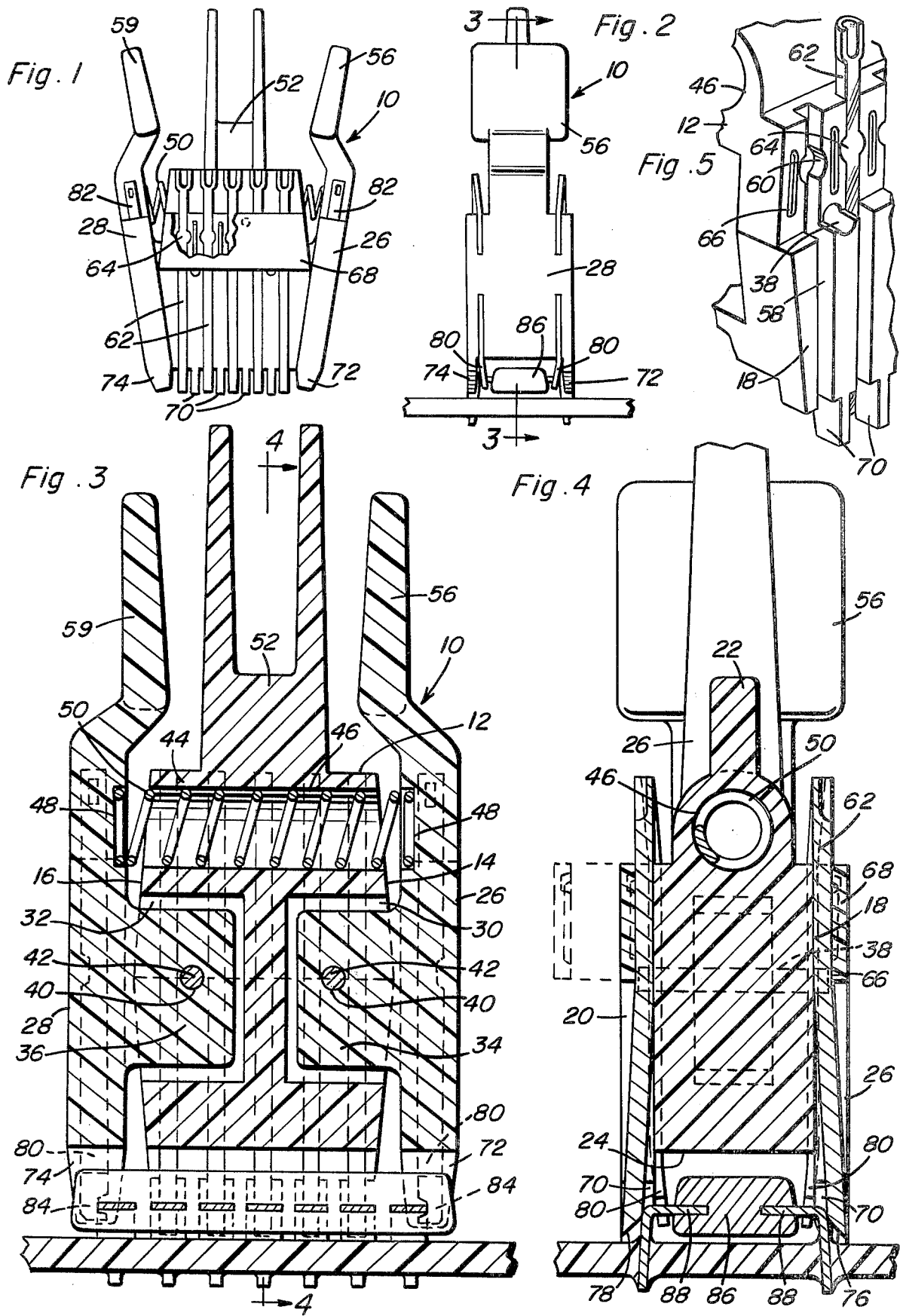

COMBINED TEST CLIP AND COMPONENT EXTRACTION TOOL

BACKGROUND OF THE INVENTION

Various forms of clip assemblies of the pivoted jaw and spring-biased type have been heretofore designed and various test clips of different designs have been heretofore provided for testing and extracting electronic components. Examples of various forms of test clips and extraction devices as well as other structures including structural features similar to some of the basic structural components of the instant invention are disclosed in U.S. Pat. Nos. 2,760,174, 3,101,230, 3,169,816, 3,506,949, 3,551,878, 3,573,706 and 3,750,085.

However, these previously known structures are not capable of functioning both as test clips and component extraction tools.

BRIEF DESCRIPTION OF THE INVENTION

The combined test clip and component extraction tool of the instant invention is constructed in a manner whereby electronic components including integrated circuit packages may be readily tested or extracted, as desired. The clip is designed in a manner whereby relatively insulated test terminals or contacts may be simultaneously engaged with the terminals of a mounted integrated circuit package and thus conveniently tested. In addition, the clip includes structure whereby extraction hooks may be engaged with the four extreme end conductor elements of an integrated circuit package for extraction of the package from a circuit board or the like. The test clip includes structure whereby the test terminals or contacts are tightly frictionally engaged with the conductor elements of an associated integrated circuit package thereby affording reliable testing and the test clip is further constructed in a manner whereby its physical dimensions enabling the clip to be engaged with an integrated circuit package for testing or extraction of the package even when clearance with an adjacent electronic component is limited.

The main object of this invention is to provide a combined test clip and electronic component extraction tool which may be readily engaged with an electronic component such as an integrated circuit package for testing of the latter or its extraction from an associated circuit board.

Another object of this invention is to provide an apparatus in accordance with the preceding object including structural features ensuring proper electrical contact between the test contacts or terminals of the clip and the corresponding conductor elements of the integrated circuit package to be tested.

A further object of this invention is to provide an apparatus constructed in a manner whereby insulated portions thereof are provided for at least partially guiding the test clip into operative engagement with an associated integrated circuit package.

Another very important object of this invention is to provide a test clip which may be readily engaged with an associated integrated circuit package merely by pushing the clip into engagement with the package and with the clip provided with structure for automatically lockingly engaging the circuit package for efficient testing thereof or removal of the circuit package from a circuit board.

A final object of this invention to be specifically enumerated herein is to provide a combined test clip and component extraction tool in accordance with the preceding objects and which will conform to conventional forms of manufacture, be of simple construction and easy to use so as to provide a device that will be economically feasible, long lasting and relatively trouble free in operation.

These together with other objects and advantages which will become subsequently apparent reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIG. 1 is a side elevational view of the test clip with a near side portion thereof being broken away to more clearly illustrate some of the internal structural features of the clip;

FIG. 2 is an end elevational view of the clip as seen from the left side of FIG. 1 and with the clip operatively engaged with an integrated circuit package;

FIG. 3 is an enlarged fragmentary vertical sectional view taken substantially upon the plane indicated by the section line 3—3 of FIG. 2;

FIG. 4 is a vertical sectional view taken substantially upon the plane indicated by the section line 4—4 of FIG. 3 and with an exploded position of one of the insulative contact retainer panels illustrated in exploded position by phantom lines; and FIG. 5 is a fragmentary perspective view of one corner end portion of the body of the clip illustrating the manner in which the conductive contacts are anchored in opposite sides of the body.

DETAILED DESCRIPTION OF THE INVENTION

Referring now more specifically to the drawings, the numeral 10 generally designates the test clip of the instant invention. The clip 10 includes a body 12 having opposite ends 14 and 16, opposite sides 18 and 20 and a top or upper portion 22 and a bottom or lower portion 24.

The clip 10 also includes a pair of opposite end upstanding levers 26 and 28.

The opposite ends of the body 12 include vertically elongated recesses 30 and 32 in which inwardly projecting lugs 34 and 36 carried by the vertical mid-portions of the levers 26 and 28 are snugly and oscillatably received. The body includes opposite end transverse bores 38 formed therethrough and the bores 38 open into the recesses 30 and 32. In addition, the lugs 34 and 36 include transverse bores 40 which are registrable with the corresponding bores 38 and pivot pins or shafts 42 are secured through the bores 38 and the bores 40 whereby the levers 26 and 28 are oscillatably supported from opposite end portions of the body 12 for angular displacement about axes extending transversely of the body 12.

An upper portion 44 of the body 12 has a longitudinal bore 46 formed therethrough and the inner faces of the levers 26 and 28 opposing the opposite ends of the bore 46 include recesses 48 in which the opposite ends of a compression spring 50 slidably received through the bore 46 are seated.

The upper portion 44 of the body 12 includes an upwardly projecting forked handle portion 52 and the upper ends of the levers 26 and 28 include inwardly offset upper end portions 56 and 59 which closely oppose the opposite end surfaces of the forked handle 52.

From FIG. 5 of the drawings it may be seen that the opposite sides 18 and 20 of the body 12 include vertically extending outwardly opening grooves 58 including transversely widened upper end portions 60. A plurality of elongated upstanding spring contacts 62 including transversely widened midportions 64 are seated in the grooves 58 with the widened portions 64 thereof received in the widened upper end portions 60 of the grooves 58, thereby interlocking the contacts 62 with the body 12 against longitudinal displacement of the contacts 62 in the grooves 58. Further, the opposite sides 18 and 20 of the body 12 include outwardly opening relieved portions 66 in which retainer plates 68 overlying the contacts 62 are secured by means of sonic welding.

The body 12 and levers 26 and 28 are constructed of dielectric material and the contacts 62 are of course constructed of conductive material. Further, the opposite sides of the body 12 include longitudinally spaced depending integral blade portions 70 spaced between the lower ends of adjacent contacts 62.

The lower ends of the levers 26 and 28 include depending opposite side legs 72 and 74 and the lower ends of the contacts 62 are beveled as at 76 and 78. Further, the levers 26 and 28 also include opposite side depending contacts 80 including exposed upper ends 82 and the lower ends of the contacts 80 define hooks 84 opening inwardly toward the remote levers. The lower end portions of the contacts define spring contacts which may be biased outwardly of the corresponding sides of the body 12 and the inner sides of the legs 72 and 74 act as guide surfaces when displacing the clip 10 downwardly toward an integrated circuit package such as that indicated by the reference numeral 86.

It will be noted that the hook defining lower ends of the contacts 80 are disposed inwardly of the lower ends of the corresponding contacts 62. Accordingly, when the clip 10 is displaced downwardly over the integrated circuit package 86 in the manner illustrated in FIG. 2, 3 and 4 of the drawings, the lower ends of the contacts 62 engage the conductors 88 of the package 86 and are slightly spring-biased outwardly thereby and the hooks 84 may interlockingly engage the opposite end conductors 88 of the package 86. Of course, once the clip 10 has been positioned in the manner illustrated in FIGS. 2, 3 and 4 of the drawings individual test leads may be electrically connected to selected conductors 88 of the package 86 through the contacts 62 and 80 and the clip 10 may also be utilized to extract the package 86, if desired. When the lower ends of the contacts 62 engage the conductors 88 they are spring-biased apart so as to tightly frictionally engage the conductors 88 and thereby enjoy a good electrical contact therewith. Further, the spring-biasing action applied to the levers 26 and thus the contacts 80 by means of the spring 50 ensures good contact with the end conductors 88 of the package 86 by the contacts 80.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to, falling within the scope of the invention.

What is claimed as new is as follows:

1. A combined test clip and electronic component extraction tool comprising:

a. a main body including opposite ends, opposite sides, a top and a bottom;
 b. a pair of upstanding levers pivotally secured intermediate their upper and lower end portions to opposite ends of the body for limited oscillation about an axis transverse to the sides of the main body;
 c. means for yieldingly biasing the upper ends of the levers apart;
 d. a plurality of elongated upstanding longitudinally spaced conductive side contacts insulated from each other and supported by and projecting downwardly from each side of the main body; and
 f. a pair of upstanding, opposing, conductive contacts depending from each lever, each lever-depending contact having an exposed upper and lower end, the lower end of each lever-depending contact comprising conductive hooks opening inwardly toward the opposing lever.

2. The tool of claim 1 wherein the hooks are spaced slightly inwardly of the bottom of the side contacts.

3. The tool of claim 1 wherein at least a portion of the side contacts comprise spring contacts having lower ends permitting outward movement from the main body when the tool is displaced around an electronic component.

4. The tool of claim 1 wherein each lever includes a pair of opposing depending dielectric legs wherein each leg is disposed slightly outwardly of one of the hooks on the corresponding lever.

5. The tool of claim 4 in which each leg comprises an inner surface adjacent the corresponding hook forming a guide surface and wherein at least a portion of each guide surface extends toward the opposing lever with respect to the corresponding hook.

6. The tool of claim 1 wherein the sides of the body include depending insulative fingers, each finger being interposed between adjacent side contacts.

7. The tool of claim 6 wherein said fingers are in the form of blade members disposed in planes generally normal to the longitudinal center line of said body.

8. A combined test clip and electronic component extraction tool comprising a body including opposite ends and sides as well as a bottom, a pair of upstanding levers pivotally supported from opposite ends of said body for limited oscillation about an axis transverse to the sides of said body, the lower ends of each lever including a pair of opposing, depending dielectric legs, each of said legs including an upstanding, conductive contact having an exposed upper and lower end, the lower portion of each contact comprising a hook opening toward the opposing lever.

9. The tool of claim 8 in which each side of the body includes a row of upstanding conductive side contacts supported therefrom.

10. The tool of claim 9 in which each side of the body includes rows of depending insulative fingers, each finger being interposed between adjacent side contacts, wherein the side contacts and the insulative fingers project below the bottom of the body.

11. The tool of claim 10 wherein the fingers are in the form of blade members disposed in planes generally normal to the longitudinal center line of the body.

12. The tool of claim 9 wherein the lower ends of the upstanding side contacts permit outward movement from the sides of the body when the tool is displaced toward an electronic component.

13. The tool of claim 8 including means yieldingly biasing the upper ends of the levers toward their limit positions of maximum spacing therebetween.

* * * * *